(12) United States Patent
Chong et al.

(10) Patent No.: US 6,488,039 B1
(45) Date of Patent: Dec. 3, 2002

(54) STATE OF THE ART CONSTANT FLOW DEVICE

(75) Inventors: Kam Beng Chong, Singapore (SG); Chin Choon Khee, Singapore (SG); Chua Kien Heng, Singapore (SG); Teh Guai Cheng, Singapore (SG)

(73) Assignee: Chartered Semiconductor Manufacturing, Singapore (SG)

( * ) Notice: Subject to any disclaimer, the term of this patent is extended or adjusted under 35 U.S.C. 154(b) by 108 days.

(21) Appl. No.: 09/671,510

(22) Filed: Sep. 27, 2000

(51) Int. Cl.[7] .............................. B08B 3/00; B08B 7/04
(52) U.S. Cl. ...................... 134/56 R; 134/186; 134/902
(58) Field of Search ................................ 134/186, 155, 134/56 R, 57 R, 902, 1, 1.3, 2, 18, 25.1, 25.4, 26, 34

(56) References Cited

U.S. PATENT DOCUMENTS

| | | | |
|---|---|---|---|
| 4,483,357 A | | 11/1984 | Rao et al. ........................ 137/3 |
| 4,852,053 A | * | 7/1989 | Turrie .......................... 137/391 |
| 4,855,023 A | | 8/1989 | Clark et al. ................... 204/130 |
| 4,917,123 A | | 4/1990 | McConnell et al. ........... 134/95 |
| 5,722,441 A | * | 3/1998 | Teramoto ...................... 134/113 |
| 6,045,621 A | * | 4/2000 | Puri et al. ...................... 134/10 |
| 6,082,381 A | * | 7/2000 | Kamikawa et al. ...... 134/102.2 |
| 6,138,698 A | * | 10/2000 | Tanaka et al. ............... 134/184 |
| 6,158,447 A | * | 12/2000 | Kamikawa et al. ...... 134/100.1 |
| 6,192,902 B1 | * | 2/2001 | Makita et al. ............... 134/113 |
| 6,221,167 B1 | * | 4/2001 | Karasawa ....................... 134/1 |
| 6,245,250 B1 | * | 6/2001 | Krawzak et al. ............... 134/2 |
| 6,342,104 B1 | * | 1/2002 | Kamikawa et al. ...... 134/102.3 |
| 6,375,758 B1 | * | 4/2002 | Nakashima et al. ........... 134/2 |
| 6,378,534 B1 | * | 4/2002 | Olesen et al. ................. 134/1.3 |

* cited by examiner

*Primary Examiner*—Alexander Markoff
(74) *Attorney, Agent, or Firm*—George O. Saile; Rosemary L. S. Pike

(57) ABSTRACT

A new method and apparatus is provided that assures constant fluid flow of the fluid that is entered into a semiconductor device processing tank or container. A flow meter is set to a particular flow rate; the fluid that comes from the POU is routed through the flow meter. The fluid passes through a flow meter into a processing tank. The fluid is allowed to fill the container up to an overflow point of the container. An overflow basin is provided into which the overflowing fluid is routed from where the fluid is drained into a fluid reclaim vessel. The overflow is detected by a sensor, the sensor activates an overflow relieve valve that is mounted in the bottom of the container. The overflow relieve valve is opened and drains fluid from the container thus counteracting the overflow of the fluid into the overflow basin. The interaction between the overflow detector and the overflow relieve valve assures a constant rate of supply of the fluid to the processing tank or container.

22 Claims, 1 Drawing Sheet

STATE OF THE ART CONSTANT FLOW DEVICE

BACKGROUND OF THE INVENTION (1) Field of the Invention

The invention relates to the fabrication of integrated circuit devices, and more particularly, to a method and apparatus for assuring constant flow of fluids that are used in the preparation of chemical solutions.

(2) Description of the Prior Art

In preparation for and during the creation of semiconductor devices, it is frequently required to provide chemical solutions in fluid form that are used during the manufacturing of semiconductor devices. These fluids may be pure, undiluted chemicals or, as is more often the case, they may be fluids that contain a mixture of several chemicals that combined and are aimed at performing a particular processing step in the sequence of creating semiconductor devices. As a basic example can be cited the use of DI water, which is frequently used for purposes of rinsing surfaces that have been processed in order to remove remnants of chemicals that have been used during the processing of a semiconductor substrate. In preparing a chemical mix, such as 50:1 or 10:1 HF, which is a solution that is frequently applied to for instance remove oxidized Plasma Polymerized Methylsilane (PPMSO) after a buffer oxide etch has been applied to the PPMS, it is critical that the solution of HF contains the correct proportion and the correct chemical dilution that is required for the application of the HF solution. A HF dip is typically a one-time process performed at atmospheric pressure using a conventional wet bench process with a gas source of $H_2O:HF=100:1$ for a duration of about 90 seconds. This latter example is indicated at this time to indicate that precise control of the proportion and the dilution consistency are important to the success of a chemical process and are part of a number of control parameters that apply to this process.

In providing or preparing chemical solutions in fluid form for the processing of semiconductor devices, these solutions and their derivatives are frequently passed through a fluid distribution system. A fluid distribution system typically consists of a tubular arrangement where the total distribution system potentially contains a large number of branches or points of division such that the fluids can be provided at the desired points of use of the fluids. It is clear that a fluid distribution system can therefore be very complex, which makes the requirement of even and controlled flow of the fluid through all components of the fluid distribution system that more demanding. Fluid distribution systems have, for many applications, a return loop so that the fluid distribution system is a closed loop system. Fluids that have been used can, after the application of the fluids has been completed, be treated in order to restore the fluids to an original condition for further reuse. This process has obvious advantages of cost control. Fluids that pass through a fluid distribution system may further be subjected to additional actions such as temperature control and other environmental control of the fluids in order to prepare the fluids for specific processing steps. This activity as yet adds further complexity to the requirement that the correct proportion and the correct consistency of the fluids must be controlled at all points in the fluid distribution system.

Prior Art devices and methods that are to assure fluid consistency are typically applied at the point-of-use (POU). This method of control is, in many respects, an "after the fact" method of control in that the POU validation method only observes fluid consistency at the point where the fluid is applied rather than at frequent validation points that are strategically placed within the loop or the system that provides the fluids. The reason that makes the POU method attractive is the high cost of the currently used flow control valves. The flow control valves, in applying the POU method of control, are subjected to a relatively heavy duty method of use and are therefore prone to require frequent replacement and/or frequent maintenance support.

An improved method and apparatus of controlling fluid flow in a fluid distribution system is therefore of benefit for a semiconductor manufacturing environment. The invention provides such an improved method and apparatus.

U.S. Pat. No. 4,855,023 (Clark) shows an apparatus for an on-site chemical reprocessing of liquid having tanks.

U.S. Pat. No. 4,917,123 (McConnell et al.) shows a wafer cleaning station having tanks and a Mace valve.

U.S. Pat. No. 4,483,357 (Rao et al.) shows a 2-stage in-line acid mixing setup with tanks.

SUMMARY OF THE INVENTION

A principle objective of the invention is to provide a method and apparatus that assures constant pressure fluid distribution in a semiconductor processing environment.

Another objective of the invention is to provide a method and apparatus that assures consistent fluid distribution in a semiconductor-processing environment.

Yet another objective of the invention is to provide a method and apparatus to negate effects of random pressure and/or flow variations in a fluid distribution system, enabling consistent fluid distribution in a semiconductor processing environment that is not affected by outside influences.

A still further objective of the invention is to provide a method and apparatus that negates any effects of a sudden surge in demand for fluid at a particular point in the fluid distribution system thus assuring consistent fluid distribution at all points that are supplied by the fluid distribution system.

In accordance with the objectives of the invention a new method and apparatus is provided that assures constant fluid flow of the fluid that is entered into a semiconductor device processing tank or container. A flow meter is set to a particular flow rate, the fluid that comes from the POU is routed through the flow meter. The fluid that leaves the flow meter runs into a processing tank or container. It is the objective of the method and apparatus of the invention to keep the flow of the fluid through this container at a constant flow rate. The fluid is allowed to fill the container up to an overflow point of the container, the fluid is not allowed to go over this level. An overflow basin is therefore provided for the fluid into which the overflowing fluid is allowed to run. Once the fluid reaches the overflow level of the container, the fluid runs into an overflow catch basin (which is part of the fluid container) from where the fluid is drained into a fluid reclaim vessel via a basin conduit. This occurrence of the overflow (the fluid running from the overflow basin to the fluid reclaim vessel) is detected by a sensor, the sensor activates an overflow relieve valve that is mounted in the bottom of the container. The overflow relieve valve is opened and drains fluid from the container thus counteracting the overflow of the fluid into the overflow basin. The interaction between the overflow detector and the overflow relieve valve assures (dependent on the interrelation of the fluid flow through the entry valve and the overflow relieve valve) a constant rate of supply of the fluid to the processing tank or container.

DESCRIPTION OF THE PREFERRED EMBODIMENTS

Figure 1:
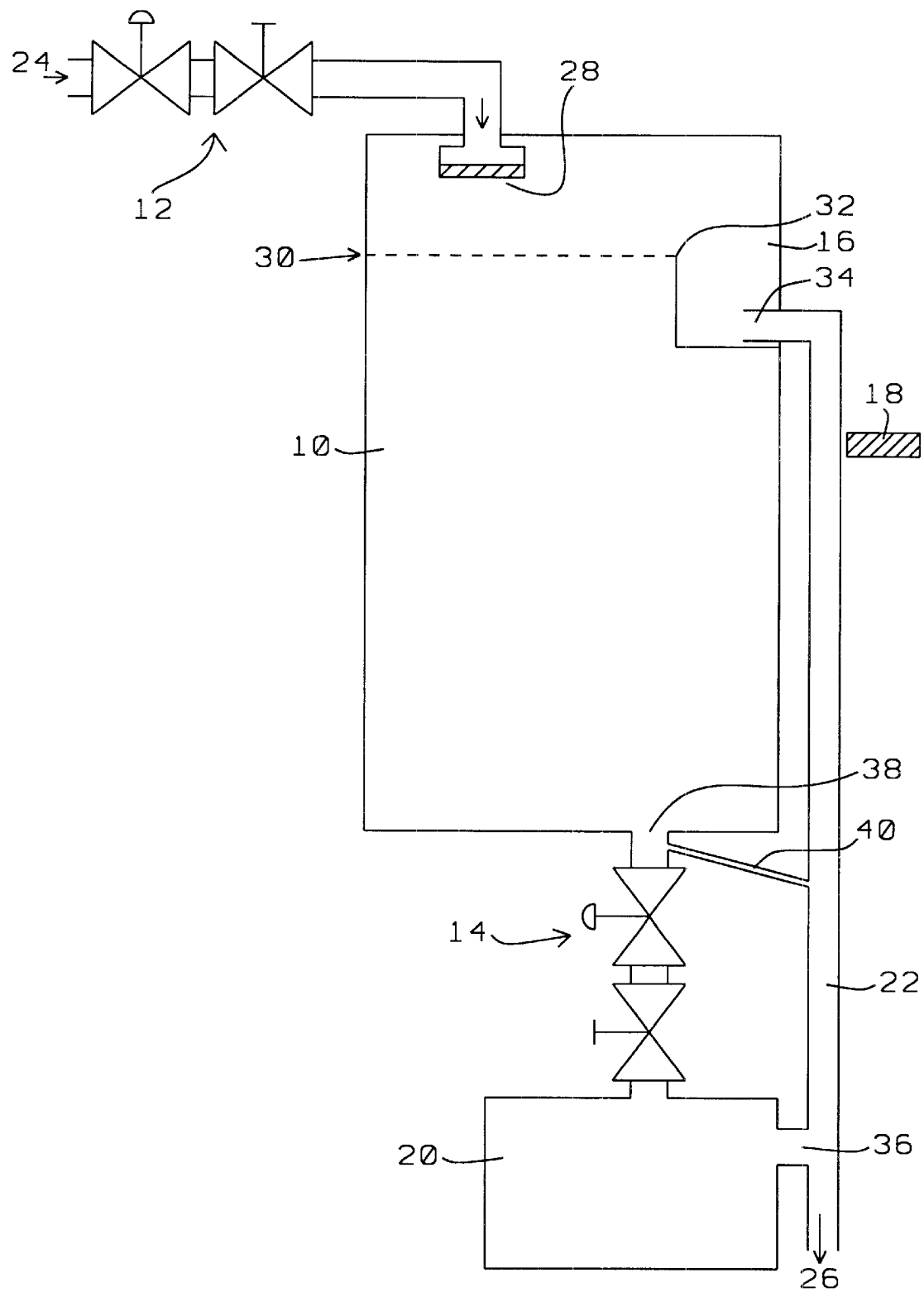
FIG. 1 shows an overview of the method and apparatus of the invention.

Referring now specifically to FIG. 1, there is shown an overview of the method and apparatus of the invention. The main components that are shown in FIG. 1 are:

- 10 is the fluid container, it is the objective of the method and apparatus of the invention to keep the flow rate of the fluid that runs through container 10 at a constant level
- 12 is the valve that controls the entry of the fluid into container 10
- 14 is the valve that controls the overflow relieve that is provided to the container 10
- 16 is the overflow basin that is part of the container 10
- 18 is the proximity sensor that detects that occurrence of overflow from the overflow basin 16
- 20 is the overflow relieve basin into which fluid that is extracted from the container 10 via the overflow relieve valve 14 is routed
- 22 is the conduit for the fluid that overflows from the overflow basin 16 to a fluid reclaim location (not shown in FIG. 1)
- 24 is the fluid that is extracted from the Point-Of-Use (POU)
- 26 is the fluid that is routed from the overflow basin 16 and the overflow relieve basin 20 to a fluid reclaim location (not shown in FIG. 1)
- 28 is a strainer that is used to assure that no impurities enter the container 10, these impurities may interfere with the method and apparatus of the invention
- 30 is the level to which the container 10 is to be filled, it is the reference level of the surface of the fluid that is contained in vessel 10; the fluid in container 10 must be kept at this level
- 32 is the point (overflow lip) over which the fluid flows from the container 10 into the overflow basin 16 after the fluid that is contained in the container 10 has reached the reference level 30
- 34 is the exit of the overflow basin 16
- 36 is the exit of the overflow relieve basin 20
- 38 is the bottom exit of the container 10, and
- 40 is an exit from the fluid container 10 that is used to remove excess water from the tank 10 when this tank is not in use; the exit has no further significance for the explanation of the apparatus and method of the invention.

The process and apparatus of the invention is next discussed. At the start of the process of the invention, it is assumed that no fluids are present in container 10. Valve 12 is opened and set at a particular fluid flow rate, for instance 1200 ml/minute. At this time and during the time that the container 10 initially fills up with fluid, valve 14 is closed so that no fluid escapes from vessel 10 while the vessel is initially being filled.

The container 10 is allowed to fill up to the reference level 30 at which point the fluid is allowed to spill over into the overflow basin 16 via the overflow lip 32. The fluid that spills into the overflow basin 16 is allowed to immediately exit the overflow container 16 via the overflow basin exit 34 and drain from the overflow basin 16 to a fluid reclaim location (not shown in FIG. 1) via conduit 22. In doing so, the fluid activates the proximity sensor 18 which functionally interfaces with the overflow relieve valve 14. It is clear that valve 12 controls the fluid that enters tank 10 while valve 14 is the valve that controls the exit of the fluid from the tank 10 to a "process bath".

The occurrence of the overflow of the fluid from the overflow basin 16 clearly indicates that the fluid in container 10 exceeds the limit 30 or, in other words, that the flow rate of the fluid entering the container 10 is too high. This exceeding of the limit 30 is against the objectives of the method and apparatus of the invention, that is to assure that the level of the fluid that is contained in container 10 does not exceed this limit 30. It can be argued that the overflow basin in and of itself assures that the fluid level does not exceed the level 30 since any time that the fluid would exceed this limit the fluid is drained from the container 10 via the overflow basin. This does however not take into account sudden changes or surges of demand for the fluid that is contained in container 10. In order to meet high demand for the fluid that is contained in vat 10, the flow of fluid into the container 10 must be at a high rate. This means that sudden changes of the level of the fluid contained in vessel 10 (caused by sudden changes in the demand for the fluid) may potentially cause the fluid in container 10 to exceed the limit level 30 because the spill-over into the overflow basin 16 cannot by itself compensate for the sudden and dramatic fluctuation of fluid supply and demand. By opening the valve 14 that is supplied at the bottom of container 10, extra fluid can rapidly be removed from the container 10. Valve 14 is dynamically activated and controlled by the proximity sensor 18 meaning that the time delay incurred by the occurrence of the overflow and the opening of valve 14 is very small. When therefore changes in the level of the fluid that is contained in vat 10 are detected, the valve 14 prevents these changes to take effect by removing excess fluid through the bottom of the container.

Fluids that are removed via valve 14 are collected in the overflow relieve basin 20 from where, after these fluids have reached a certain level, these fluids can be deposited via the exit 36 from this basin to the fluid reclaim location via path 26.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An apparatus for wet processing of semiconductor wafers, comprising:
    a processing tank for positioning at least one wafer therein, said processing tank being in a closed loop circulation processing stream, said closed loop circulation processing stream passing through said processing tank, said processing tank having at least one point-of-use wherein processing fluids sequentially flow past said at least one wafer, said processing tank being hydraulically full with processing fluids when said processing fluids flow past said at least one wafer;

a means for supplying at least one fluid to said processing tank for removing contaminants from said at least one wafer, said means of supplying containing a first fluid flow control valve;

a means for first withdrawal of said processing fluids from said processing tank;

a means for second withdrawal of said processing fluids from said processing tank, said means of second withdrawal comprising a second fluid flow control valve;

a fluid overflow reference level;

a means for detecting said first withdrawal of said processing fluids from said processing tank, providing a first withdrawal signal; and a means for activating said means for second withdrawal of said processing fluids from said processing tank.

2. The apparatus of claim 1 wherein said point-of-use is a point of said closed loop circulation processing stream at which processing fluids are present and that is part of said closed loop circulation processing stream, said closed loop circulation processing stream passing through said processing tank enabling said point-of-use within said processing tank.

3. The apparatus of claim 1, wherein said means for supplying at least one fluid to said processing tank comprises said first fluid flow control valve, fluid provided from said point-of-use enters said first fluid flow control valve, fluid that exits said first flow control valve enters into said processing tank at a hydraulically elevated or high point of the processing tank.

4. The apparatus of claim 1 wherein said apparatus further comprises a particle filter means which removes particles from said processing fluid, said particle filter means being located between said means for supplying at least one fluid to said processing tank and said processing tank.

5. The apparatus of claim 1 wherein said means for first withdrawal of said processing fluids from said processing tank comprises an overflow basin.

6. The apparatus of claim 5 wherein said overflow basin comprises:

a location at a hydraulically high point within said processing tank;

a high point over which said overflow basin cannot hydraulically contain fluid, said high point equals said fluid overflow reference level of said processing tank; and overflow basin drain exit located at a hydraulically low point within said overflow basin through which fluid can be released from said overflow basin.

7. The apparatus of claim 6 wherein said fluid that is released from said overflow basin, thereby exiting said processing tank, is routed to a fluid reclaim station for reuse of said released fluid.

8. The apparatus of claim 1 wherein said means for second withdrawal of said processing fluids from said processing tank comprises:

an opening at a hydraulically low point in said processing tank, fluid being released from said processing tank through said low hydraulic point in said processing tank;

a second fluid flow control valve, said fluid being released through said opening at said hydraulic low point of said processing tank being routed through said second fluid flow control valve; and an overflow relieve basin into which said fluid being routed through said second fluid flow control valve is deposited.

9. The apparatus of claim 8 wherein said overflow relieve basin comprises an overflow relieve basin drain exit located at a hydraulically low point within said overflow relieve basin, fluid being released from said overflow relieve basin through said overflow relieve basin drain exit of said overflow relieve basin.

10. The apparatus of claim 9 wherein said fluid that is released through said overflow relieve basin drain exit of said overflow relieve basin being routed to a fluid reclaim station for reuse of said released fluid.

11. The apparatus of claim 1 wherein said fluid overflow reference level in said processing tank is the highest level within said processing tank that said processing fluids can rise in said processing tank.

12. The apparatus of claim 1 wherein said means for detecting said first withdrawal of said processing fluids from said processing tank is a proximity detector that is mounted in close physical proximity to where said first withdrawal of said processing fluids from said processing tank is routed.

13. The apparatus of claim 1 wherein said means for activating said means for second withdrawal of said processing fluids from said processing tank comprises:

detecting said first withdrawal of said processing fluids from said processing tank, providing a first withdrawal signal; and connecting said first withdrawal signal to said second fluid control valve, activating said means for second withdrawal of said processing fluids from said processing tank.

14. The apparatus of claim 1 with the addition of providing a means for recirculating said processing fluids, conserving processing fluids, said means comprising fluid propulsion capabilities inserted in said closed loop circulation processing stream.

15. The apparatus of claim 1 with the addition of providing a means for removing impurities from said processing fluids, rejuvenating said processing fluids, said means comprising a fluid strainer.

16. The apparatus of claim 1 with the addition of a means for supplying at least one chemical reactant to said processing fluids for reacting with at least one of said wafers in addition to a means for withdrawing at least one chemical reactant from said processing fluids, rejuvenating said processing fluids, said chemical reactant agents interacting with said at least one wafer for purposes of wafer processing, said means for supplying at least one chemical reactant augmenting said point-of-use wet processing capabilities.

17. The apparatus of claim 16 wherein said means for supply and withdrawal of chemical reactant to said processing fluids comprises reactant supply means, further comprises means for providing metered amounts of reactant to said processing fluids.

18. The apparatus of claim 17 including means for supplying rinsing fluid combined with chemical reactant to said closed loop circulation processing stream in addition to mixing means for mixing said chemical reactant and said rinsing fluid prior to passing said mixed chemical reactant and said rinsing fluid to said means for supplying at least one fluid to said processing tank.

19. The apparatus of claim 1 wherein said closed loop circulation processing stream comprises:

multiple fluid reservoirs;

means for differential pressure measurements between points within said closed loop circulation processing stream;

means for circulating said processing fluids from at least one of said multiple fluid reservoirs into said closed loop circulation processing stream;

means for circulating said processing fluids from said closed loop circulation processing stream into at least one of said multiple fluid reservoirs; and means for circulating said processing fluid between said multiple fluid reservoirs.

20. The apparatus of claim 19 with additional means for agitating said processing fluids at at least one point in said closed loop circulation processing stream.

21. The apparatus of claim 1 with additional means of continuously recycling said processing fluids through said closed loop circulation processing stream.

22. The apparatus of claim 1 wherein said processing tank for containing said at least one wafer in a closed loop circulation processing stream comprises at least one magazine for containing and supporting said at least one semiconductor wafer, said wafers being mounted in said magazine with their major surfaces parallel to said processing stream, said at least one wafer being removed from said processing tank after completion of processing of said at least one wafer therein.

* * * * *